United States Patent [19]

Rogers

[11] Patent Number: 5,414,366
[45] Date of Patent: May 9, 1995

[54] ELECTROMAGNETIC FIELD SUSCEPTIBILITY TEST APPARATUS AND METHODS

[75] Inventor: Wesley A. Rogers, Grosse Pointe Park, Mich.

[73] Assignee: Electronic Development, Inc., Grosse Pointe Park, Mich.

[21] Appl. No.: 153,502

[22] Filed: Nov. 17, 1993

Related U.S. Application Data

[63] Continuation of Ser. No. 692,719, Apr. 29, 1991, abandoned.

[51] Int. Cl.$^6$ .......................................... G01R 31/00
[52] U.S. Cl. .................................. 324/627; 324/612; 324/72
[58] Field of Search ............... 324/602, 603, 605, 609, 324/612, 613, 627, 628, 632, 637, 72, 72.5, 149, 158 F; 364/802

[56] References Cited

U.S. PATENT DOCUMENTS

| | | | |
|---|---|---|---|
| 3,727,137 | 4/1973 | Barron | 364/802 |
| 4,207,518 | 6/1980 | Hopfer | 324/95 |
| 4,255,750 | 3/1981 | Riley | 324/627 X |
| 4,281,287 | 7/1981 | Andrews et al. | 324/95 |
| 4,360,865 | 11/1982 | Yasumura et al. | 363/126 |
| 4,642,558 | 2/1987 | Batchman et al. | 324/72.5 |
| 4,647,844 | 3/1987 | Biegon et al. | 324/627 |
| 4,707,652 | 11/1987 | Lowitz | 324/631 |
| 4,845,378 | 7/1989 | Garbe et al. | 307/106 |
| 4,939,446 | 7/1990 | Rogers | 324/72 |
| 4,962,358 | 10/1990 | Svetanoff | 324/627 |
| 4,973,911 | 11/1990 | Marshall | 324/628 |
| 4,977,376 | 12/1990 | Schiek et al. | 324/605 X |
| 5,006,788 | 4/1991 | Goulette et al. | 324/158 F |
| 5,068,616 | 11/1991 | Broyde et al. | 324/627 |
| 5,311,116 | 5/1994 | Rogers | 324/72.5 |

FOREIGN PATENT DOCUMENTS

| | | | |
|---|---|---|---|
| 0287771 | 2/1988 | European Pat. Off. | H01T 1/100 |
| 2215067A | 9/1989 | United Kingdom | G01R 31/00 |
| 2256057A | 11/1992 | United Kingdom | G01R 31/00 |
| WO92/20152 | 11/1992 | WIPO . | |

OTHER PUBLICATIONS

Bulletin for Broadband Isotropic Probe Systems by EMCO, Jan. 1990.

(List continued on next page.)

Primary Examiner—Kenneth A. Wieder
Assistant Examiner—Glenn W. Brown
Attorney, Agent, or Firm—Davis Hoxie Faithfull & Hapgood

[57] ABSTRACT

Apparatus and method for low cost monitoring the level of signal at a test point in a system for susceptibility to electromagnetic fields. A probe, including a detector diode, and a non-metallic, electrically overdamped conductor, which is transparent to the electromagnetic field, is used to monitor the signal level at a test point as an amplitude modulated radio frequency carrier. The carrier is transmitted to a monitor outside of the range of the electromagnetic field using a transmission link, such as an optical waveguide transmitter, that is transparent to the electromagnetic field when the system under test fails. The system under test can then be removed from the electromagnetic field and, for each frequency at which the system failed, a voltage can be injected, using a voltage injection probe, into the system at another point to recreate the detected level of signal at the test point that was coupled into the system from the electromagnetic field. This stimulates the effect of the susceptibility to the electromagnetic field, and permits testing of a suitable filter or other expedient applied to the system, even though the system is not exposed to the electromagnetic field. Thus, the system may be tested for susceptibility inside a shielded enclosure and subjected to a controlled electromagnetic field, and the susceptibility may be recreated and solved outside of the shielded enclosure.

56 Claims, 6 Drawing Sheets

OTHER PUBLICATIONS

Bulletin for Models
Micrograbber testclips by ITT Pomona Electronics, Jan. 1989.

H. Birkner, et al., "Elektrotechnik Und Informationstechnik", 8038 E&I Elektrotechnik and Informationstechnik 108 (1991) No. 9, Wien, AT, pp. 385–399 (partial translation).

W. Durr et al. "Novel Electromagnetic Field Probes . . . for field measurements with minimum interaction", Review of Scientific Instruments, vol. 61, No. 2, Feb. 1990, N.Y., pp. 859–864.

G. A. Jackson, "Survey of EMC Measurement Techniques", *Electronics and Communications Engineering Journal*, I., Mar./Apr. 1989, No. 2, pp. 61–70.

Ir. G. A. van der Pijl, "Methoden voor hoogfrequent-tests", 825 PT Elektronica-Elektrotechniek, 45 (1990) Apr., No. 4, Rijswijk, NL.

RADIATED SIGNAL

COUPLED SIGNAL

DETECTED SIGNAL

AVERAGE (OR PEAK) LEVEL

INJECTED SIGNAL (ADJUSTED UNTIL D'=D)

DETECTED SIGNAL

AVERAGE (OR PEAK) LEVEL

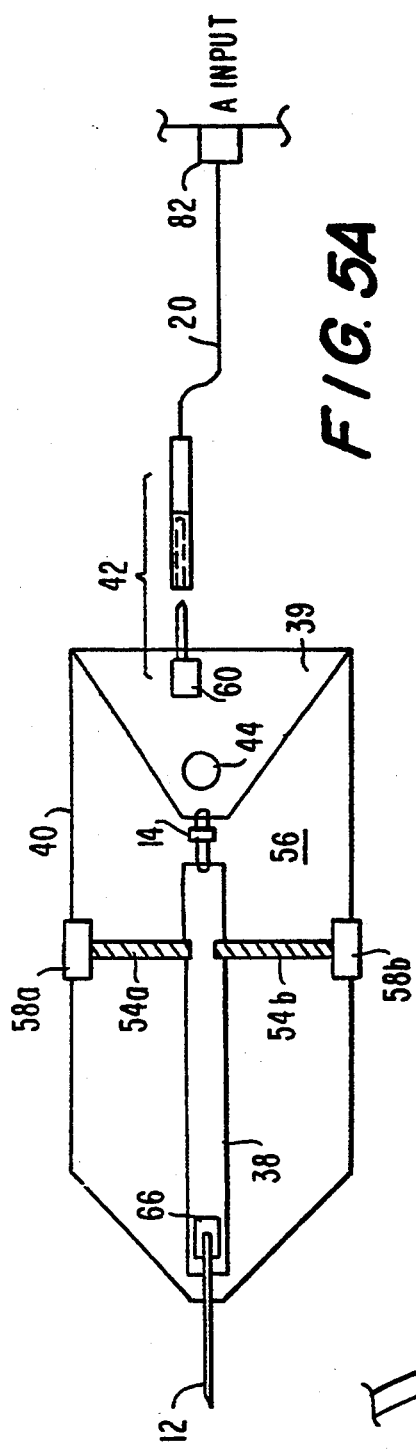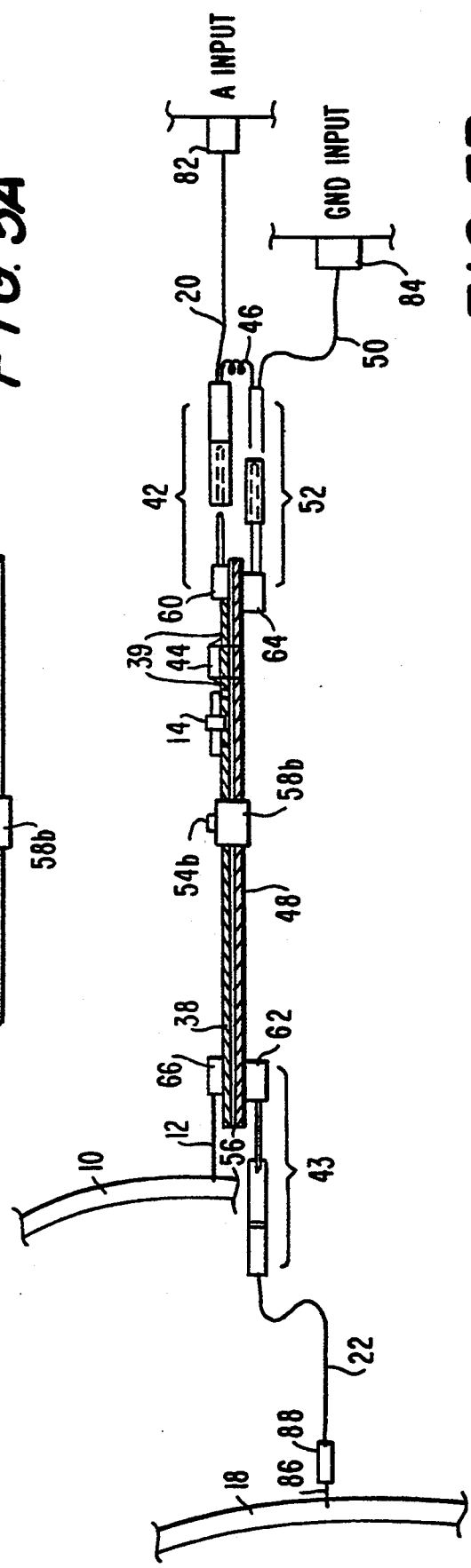
FIG. 5A
FIG. 5B

ELECTROMAGNETIC FIELD SUSCEPTIBILITY TEST APPARATUS AND METHODS

This is a continuation of application Ser. No. 07/692,719, filed on Apr. 29, 1991, now abandoned.

FIELD OF THE INVENTION

The present invention relates to the field of testing the susceptibility of devices and systems to radiated electromagnetic fields, and E fields in particular.

BACKGROUND OF THE INVENTION

Analog and digital electronic circuitry and attendant wiring may encounter serious operating difficulty in the presence of radiated electromagnetic fields. When such fields interfere with the operation of electronic circuitry, they are generally referred to as Electromagnetic Interference (EMI) fields. The circuits and attendant wiring may be shielded and filtered to provide some immunity to large electromagnetic fields, however, it is not possible or practical to design the circuitry and attendant wiring so as to ensure immunity to such fields. Indeed, shielded cables can sometimes be more susceptible to EMI problems than unshielded wires, because bending of a shielding cable, or other abuse, may produce a pin hole in the shielding, which can cause the shielding to act as a waveguide for EMI, with consequent deleterious effects.

Methods and apparatus, therefore, are required to test the susceptibility of the devices, such as integrated circuits, electrical components, and the like, and systems, such as automotive electrical systems, for both commercial and military applications, to electromagnetic fields. The term "system" is employed hereinafter to broadly describe any device or system, such as, but not limited to those described above, that may be tested for susceptibility to radiated electromagnetic fields.

Electromagnetic field testing is typically performed in shielded enclosures, or "screen rooms," which provide an environment wherein ambient electromagnetic fields are eliminated and a controlled field is produced, in order to determine, with certainty, the effect of a given level (measured in volts per meter) and frequency of electromagnetic fields on the system undergoing test. Apparatus typically used inside the shielded enclosure includes current probes attached to a system harness wire and a transmitter which sends the signals detected by the probes to a receiver outside the shielded enclosure, where the effects of the electromagnetic fields on the system are determined.

To ensure the integrity of the shielded enclosure and the results of the tests, any voltage measuring apparatus within the screen room should minimally perturb the controlled electromagnetic fields and should not inject EMI into the system. For example, any test apparatus which might reradiate electromagnetic fields impinging on the device under test, or might itself be susceptible to such fields or otherwise inject any noise into the system, must be avoided.

In U.S. Pat. No. 4,939,446, by Wesley A. Rogers, the inventor of the present invention, the performance of a system under test is observed in a shielded enclosure, with and without the presence of controlled E fields radiated by one or more antennas. The problem of reradiation of fields, or the injection of noise into the system by the test equipment itself, is eliminated through the use of non-metallic overdamped conductors, and a hybrid electrical/optical transmitter and optical cable used to transmit voltage signals from the system to a receiver monitored by an oscilloscope located outside the shielded enclosure. The approach set forth in the above patent allows accurate testing of systems in a controlled electromagnetic environment, since the overdamped conductors are transparent to the electromagnetic fields. The entire disclosure of U.S. Pat. No. 4,939,446 is incorporated herein by reference thereto.

The standard operating procedure in determining the susceptibility of systems to radiated electromagnetic fields is to place the system in a shielded enclosure, as mentioned above, and to test the susceptibility of the system over a wide range of radio frequencies, for example from 10 KHz to 18 GHz or more. The radiated field is swept through the desired frequency range, at a range of levels, e.g. between 1 v/m and 300 v/m, and the susceptibility of the system is determined over the range of frequencies. If, for example, it is determined that the system is susceptible to a radiated field at 2 GHz and a certain volt per meter level, a suitable filter or other expedient can be placed in the system, and the system retested at that frequency and level to see whether the filter is effective in removing the system's susceptibility. If the system is still susceptible, the filter must be changed, or another approach must be adopted.

This trial and error technique must be used for each frequency and level at which there is a susceptibility problem. Moreover, the trial and error testing and retesting has to take place in a shielded enclosure, as referred to above, since the FCC prohibits the generation of the antenna-radiated fields necessary to conduct open air testing, and since there is no way to tell what effect, if any, ambient fields might have on the system—the controlled environment provided by the shielded enclosure is necessary to accurately determine susceptibility problems. The testing and retesting of systems, in order to troubleshoot and alleviate susceptibility to radiated fields, usually requires between one and two weeks for each system. The rental of a shielded enclosure, such as a screen room, can cost between $1,000–$3,000 a day, and thus runs into considerable expense, and constitutes a bottleneck for the development of new systems. Furthermore, even with this procedure, there is no indication of the voltage level of EMI induced in the system that caused a failure. A test technique that allows an accurate determination of that level has long been desired.

OBJECTS AND SUMMARY OF THE INVENTION

It is therefore an object of the present invention to overcome the difficulties associated with the prior art.

It is a further object of the present invention to allow rapid and less expensive testing of systems for susceptibility to radiated electromagnetic fields.

It is a further object of the present invention to provide a probe that allows the level of a radiated field coupled into a system to be measured, without injecting the radiated field energy into the system, or otherwise affecting the level of EMI coupled into a system.

It is a further object of the present invention to provide an apparatus and method for accurately correcting for susceptibility to radiated fields outside of a shielded enclosure—after initial testing in a shielded enclosure.

It is a further object of the present invention to provide an apparatus and method for determining the level of EMI coupled into a system for particular levels and frequencies of radiated fields.

It is a further object of the present invention to provide apparatus for radio frequency (RF) voltage injection into a wire of a system under test.

It is a further object of the present invention to provide an apparatus and method that allow the injection of RF voltages into a system at a level and frequency so as to accurately simulate the susceptibility of the system to particular levels and frequencies of radiated fields.

In accordance with the present invention, a probe is first used to monitor the level of a radiated electromagnetic field, in the form of an amplitude modulated (AM) RF carrier, coupled into a system in a shielded enclosure. The probe includes a detector diode which is placed at a selected part of the system. The output of the detector diode, is applied to a monitor outside the shielded enclosure through the use of a non-metallic, overdamped wire, and a suitable transmission link. The probe and non-metallic wire are neither susceptible to the radiated field, nor do they inject EMI into the system under test.

The amplitude modulation detected by the detector diode is easily within the pass band of the non-metallic, overdamped wire so that the detected signal can pass to the monitor, through the overdamped wire and through the transmission link, which can be in the form of an optical transmitter.

The voltage level and frequency of EMI coupled into the system, as detected by the detector diode, is noted whenever the system under test fails. The system can then be removed from the shielded enclosure and for each frequency and level at which the system was susceptible to the field, an amplitude modulated RF voltage can be injected into the system at a level sufficient to recreate the level of EMI coupled into the system in the shielded enclosure, thereby essentially replicating the effect of the controlled field level in the shielded enclosure. A suitable filter or other expedient can then be applied to the system, the same voltage level can be injected into the system, and the system can be observed to see whether it no longer fails under such conditions.

In accordance with another aspect of the present invention, the probe comprises a microwave circuit designed to maintain the input impedance of the diode constant throughout the frequency range of interest.

In accordance with another aspect of the present invention, a capacitive voltage injection probe is provided for allowing the injection of voltage into the system under test when in accordance with the testing procedure described above.

BRIEF DESCRIPTION OF THE DRAWINGS

These and other objects, aspects and embodiments of the invention will be described in more detail with reference to the following drawing figures of which:

FIGS. 5A and 5B illustrate an example of the microwave circuit board implementation of the circuitry illustrated in FIG. 4;

DETAILED DESCRIPTION OF THE INVENTION

Figure 1:
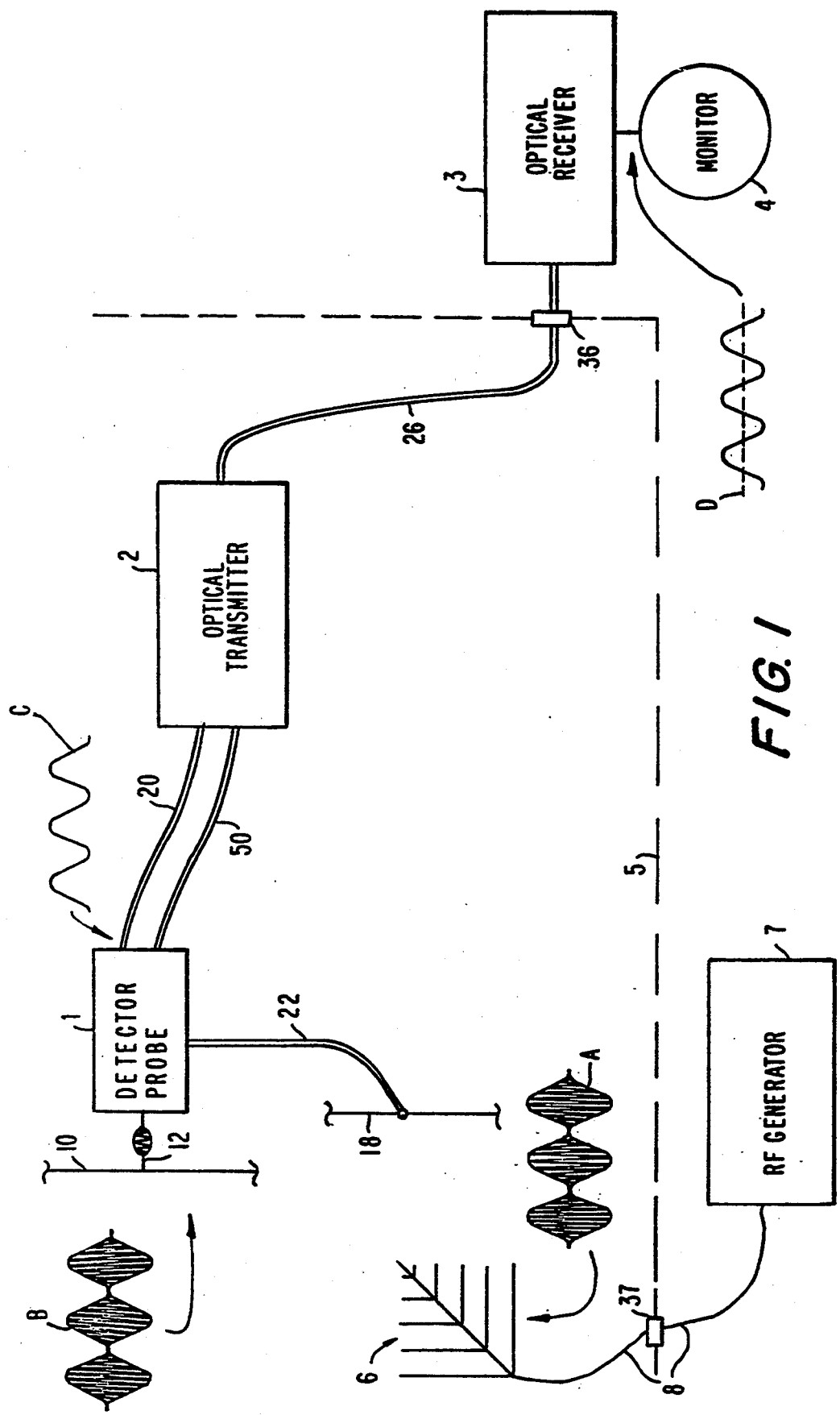
FIG. 1 is a diagram illustrating the use of the probe, non-metallic conductors and transmission link, in accordance with one aspect of the present invention, in a shielded enclosure, to determine the level of a field coupled onto wires of systems under test.
Figure 2A:
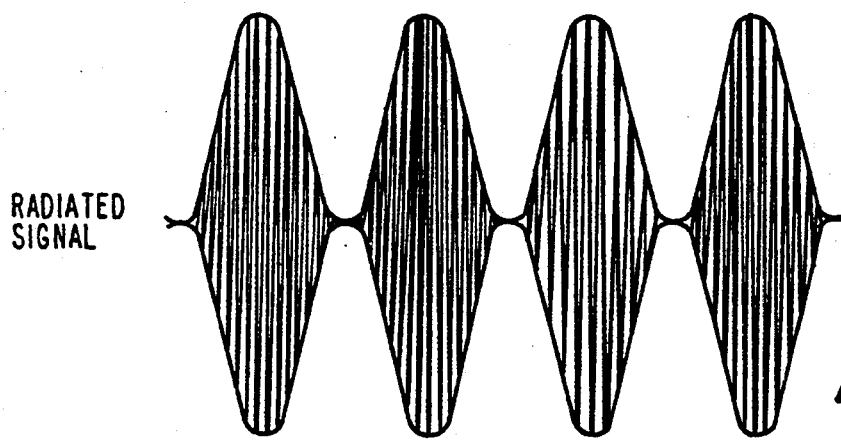
FIGS. 2A-E, 2C', and 2D' depict signals radiated, coupled, detected and injected, in accordance with the method of determining and correcting the susceptibility of systems to EMI, in accordance with another aspect of the present invention.
Figure 2B:
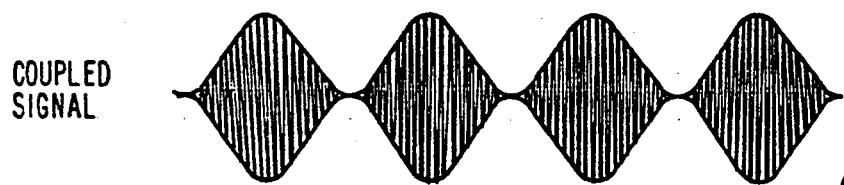
Figure 2C:
Figure 2D:
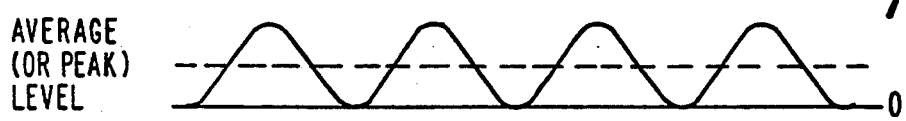
Figure 2E:
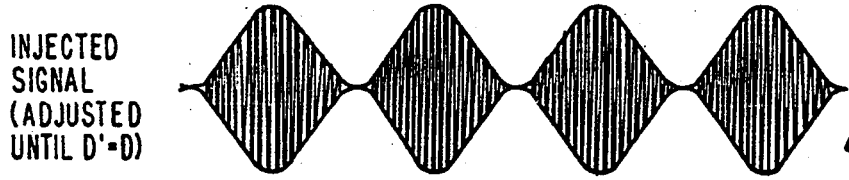
Figure 2C:
Figure 2D:
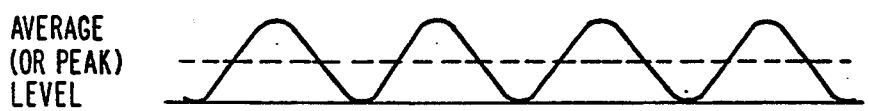

With reference to FIG. 1, a probe 1, in accordance with one aspect of the present invention, is illustrated along with an optical transmission link, as used in accordance with the method of determining and correcting for EMI susceptibility of a system under test, in accordance with another aspect of the present invention. Specifically, the probe 1 is connected to a lead 10 of the system under test, such as an automotive electrical system, by way of a clip or pin 12 which can either comprise a short conductive clip or pin, having a length less than or equal to one centimeter, to prevent the field from coupling onto the clip or pin. Alternatively, a longer clip or pin can be employed, having its insulation coated with a conductive paint or foil, open at both ends, to effectively shield it from EMI.

The detector probe 1 is also connected to a ground wire 18 from the system under test by way of non-metallic conductor 22, and to optical transmitter 2, by way of non-metallic conductors 20 and 50. The non-metallic conductors 20, 22 and 50 can be formed of one or more continuous monofilament cores of plastic which are impregnated with fine conductive particles, such as carbon, and covered with the plastic insulating sheet. A conductor material with the above described characteristics is marketed by the Polymer Corporation of Reading, Pa. under the trade name FLUOROSINT ® 719. It comprises a carbon/fluropolymer core 0.030 inches in diameter enclosed by a transparent nylon insulating cover with an outer diameter of 0.040 inches and has resistance per length of cable within the range of 20,000 to 30,000 ohms per foot. Such non-metallic cores have a uniformly distributed resistance, capacitance and inductance, causing them to be electrically overdamped and transparent to electromagnetic fields. It must be noted, however, that the bandwidth of such cores is usually no more than approximately 20 MHz, much less than many of the frequency ranges of interest. Preferably, the conductors 20, 22 and 50 can be formed of four or five such monofilament cores to reduce the linear resistance to about 6K ohms/foot, the conductors 20, 22 and 50 preferably providing a total resistance on the order of 10,000 to 20,000 ohms. However, a conventional resistor can be used instead of non-metallic conductor 22 if it is enclosed in an EMI-hardened enclosure, but the conductor between the enclosure and ground must be non-metallic.

It will be appreciated, in view of the above mentioned U.S. Pat. No. 4,939,446, that by maintaining proper lengths of the metallic conductors such as pin 12, by covering the insulation of such elements with conductive paint or foil, and by using the non-metallic conductors 20, 22 and 50, the probe in accordance with the present invention is transparent to electromagnetic fields, will not re-radiate such fields, and will not inject EMI into the system under test.

The other ends of non-metallic conductors 20 and 50 are applied to an optical transmitter 2, which includes a high input impedance amplifier having a gain on the order of approximately 1,000, although the gain of the amplifier can be selected as desired, and an LED, driven by the amplifier, which delivers a light signal to optical cable 26. The exact form of the amplifier and associated circuitry is not critical and can be comprised of a standard low drift DC or analog amplifier, but state of the art techniques should be used to insure minimum operational amplifier offset voltages. The opposite end of the optical cable 26 is applied to an optical receiver 3, which can include a photo diode or other suitable light detector, and an amplifier which receives the output of the photo diode, and which delivers an output that can be viewed on a voltage monitor 4 or a plurality of monitors, if desired. The monitor 4 can be any voltage sensitive device capable of detecting signals down to the microvolt level, such as an oscilloscope or spectrum analyzer.

The detector probe 1 and optical transmission link can be used to determine the level of a radiated field coupled into the system under test that causes the system to fail. As shown in FIG. 1, the system under test, the probe 1, the transmitter 2 and a portion of the optical cable 26, are disposed within a shielded enclosure 5 which provides a controlled electromagnetic field environment, through the activation of one or more antennas 6 which radiate an "E" field. The antenna 6 is driven by RF generator 7 in a well-known manner and is connected thereto by way of shielded cable 8. As mentioned above, shielded enclosures, such as screen rooms, are routinely used in testing systems for electromagnetic field susceptibility since FCC regulations prohibit the use of such radiated fields in the open air, and because systems being tested outside the controlled environment of the enclosure might be affected by ambient fields, and a precise cause-and-effect relationship could not be determined. By testing within the shielded enclosure, ambient fields are eliminated and the field level applied to the system is carefully controlled.

The optical cable 26 and shielded cable 8 pass through the enclosure 5 by way of waveguide-beyond-cutoff filter 36 and coaxial feedthrough connector 37, respectively. The optical transmitter 2 should be disposed within an RF shielded enclosure, but alternatively, the non-metallic conductors 20 and 50 may extend out through the filter 36, in which case the optical portion of the transmission link can be omitted, the outputs of conductors 20 and 50 being passed directly to an amplifier outside the enclosure 5.

In order to determine the level of EMI coupled into the system under test that causes the system to fail, RF generator 7 is activated to cause antenna 6 to radiate an E field in the form of an amplitude modulated carrier at a particular frequency, for example, a 1 GHz carrier, 100% amplitude modulated by a 1 KHz signal, but the frequencies, modulation levels, etc., as well as the radiated field level, can be chosen as desired, in a manner well known in the art. The signal radiated from antenna 6 is illustrated in FIGS. 1 and 2 as signal A.

A certain level of the radiated field will be coupled into the system to produce a coupled signal voltage B, as shown in FIGS. 1 and 2. The level of the coupled signal B is detected by the detector probe 1 and the envelope, corresponding to the detected signal C, as shown in FIGS. 1 and 2, is produced at the output of the detector probe. In the above described example, signal C is at the modulation frequency of 1 KHz, which is easily transmitted along the restricted bandwidth of the non-metallic conductors 20 and 50. The signal C is applied to optical transmitter 2, and it, or a signal related to its average, RMS, or peak voltage, such as voltage level D, FIG. 2, is transmitted to the optical receiver 3, and monitored by monitor 4. Conversion of signal C to a related voltage level, such as the D.C. average voltage, voltage level D, can be performed before or after transmission, and if done after transmission, a 1 KHz notch filter, in this example, can be used in the transmission path in order to eliminate any DC offsets and/or noise on the non-metallic wire or system under test. Alternatively, the signal C can be transmitted and monitored directly at monitor 4.

As is well known in EMI testing, a power supply is typically employed to supply electrical power to the system under test, through a Line Impedance Stabilization Network (LISN). LISN's are used in most EMI test set-ups to stabilize the test against variations in the impedance of the power supply.

As the testing proceeds, the carrier frequency and volt/meter level of the radiated E field, produced by antenna 6, is swept in frequency (usually from 10 KHz to 18 GHz), and in level until the system under test fails, at which point, the voltage D detected at the monitor 4 (FIGS. 1 and 2) and the carrier frequency are noted, and the frequency and signal level are swept again and the process repeated. The result of such testing will be a table of radiated field levels and frequencies, at which the system failed, along with the corresponding voltage levels D detected by the detector probe 1.

Figure 3:
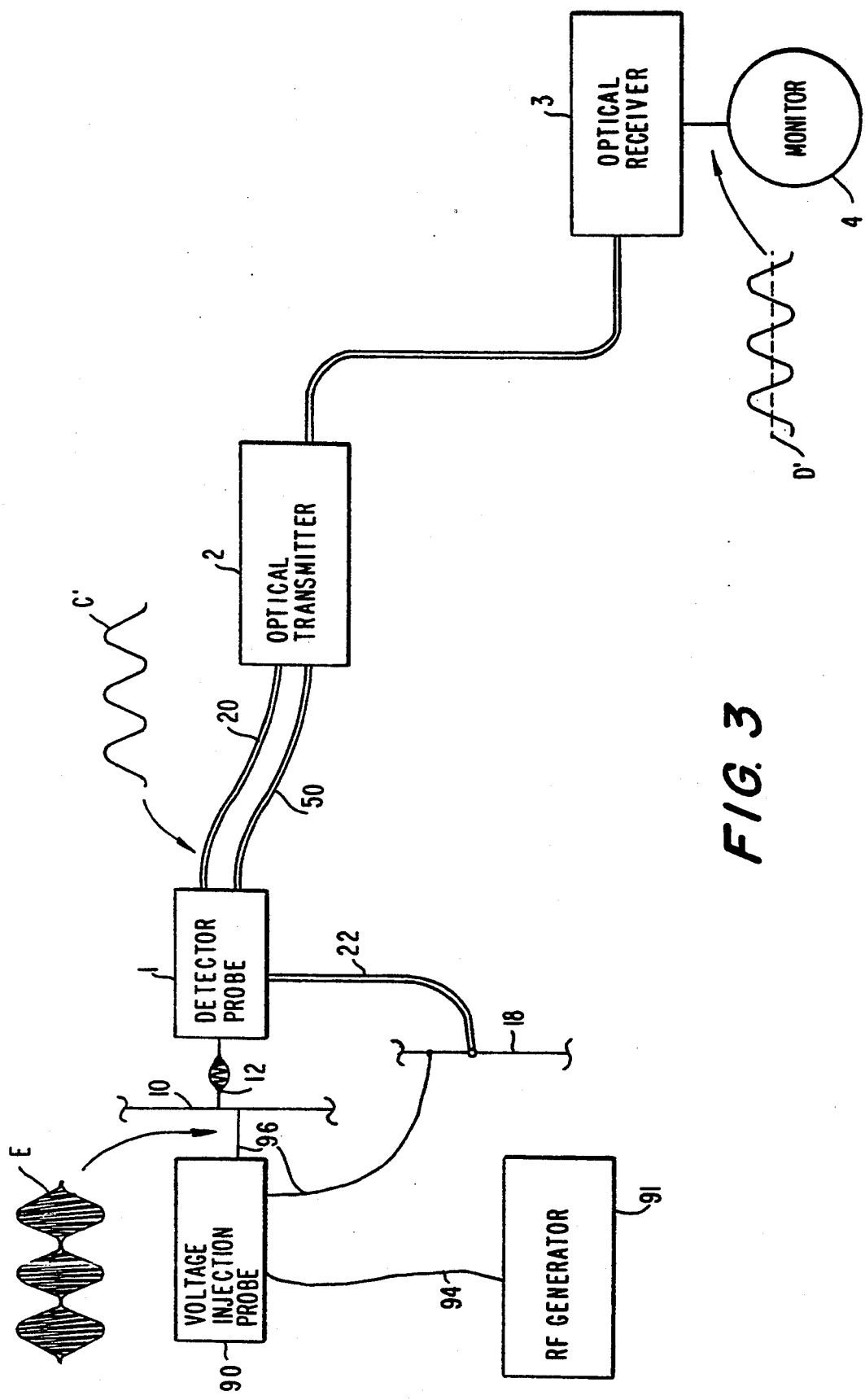
FIG. 3 is a diagram illustrating the use of the probe, non-metallic conductors and transmission link outside the shielded enclosure, to simulate the conditions within the shielded enclosure.

The system under test, the detector probe 1, the non-metallic conductors 20, 22 and 50, and the optical transmitter 2 can then be moved out of the enclosure 5 as shown in FIG. 3. A voltage injection probe 90, driven by a standard RF generator 91, is connected to wires 10 and 18 of the system under test, as shown. RF generator 91 must employ the same modulation index (in this example 100%) as the RF generator 7 used in the screen room. Then, at each frequency at which the system failed, an amplitude modulated signal (signal E, FIGS. 2 and 3) is injected into the system using the voltage injection probe 90 to be described in detail with reference to FIG. 7, below. The modulation on the injected signal E is detected by the detector probe 1, and the voltage level is monitored by monitor 4, as discussed in connection with FIG. 1. The level of the injected signal (signal E) is then adjusted at generator 91 until the voltage level D' measured at monitor 4, is equal to the level D for that frequency measured in the shielded enclosure. When this level is reached, the controlled conditions of the shielded enclosure are essentially replicated outside of the enclosure. An EMI filter or other expedient can then be placed in an appropriate location in the system under test, and the signal at the level determined as discussed above, can be injected again into the system under test, to see whether the system still fails under such conditions. If it still fails, a different approach, such as a different filter, can be employed, and the process repeated until the system no longer fails. The generator 91 can then be adjusted to the next frequency (if any) at which the system failed in the shielded enclosure, and the above procedure repeated.

Figure 4:
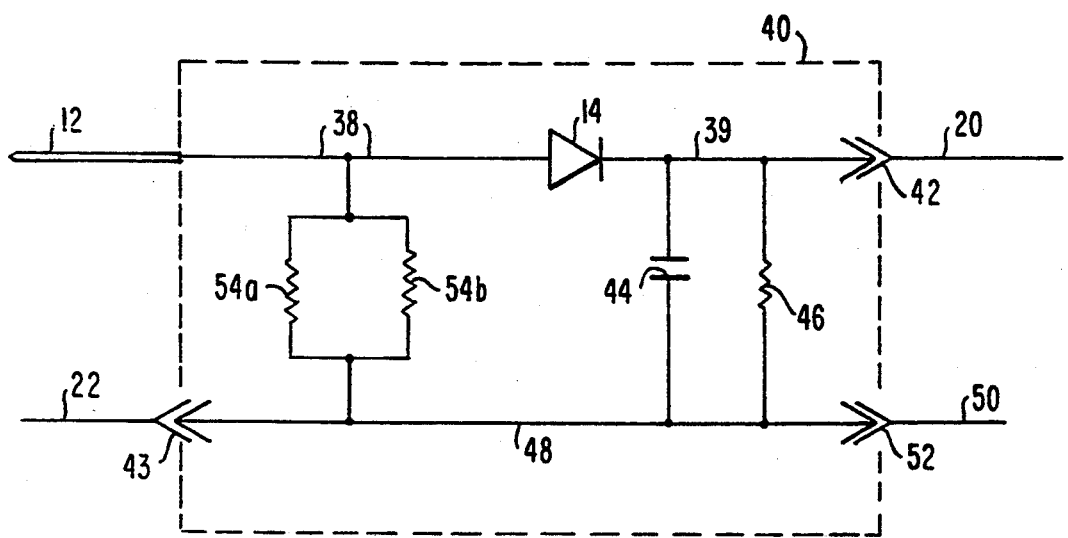
FIG. 4 is a schematic diagram illustrating a specific embodiment of the detector probe circuitry used in accordance with the present invention.

A specific embodiment of the circuitry employed in detector probe 1 in accordance with another aspect of the present invention, mounted on a microwave circuit board 40, will now be described with reference to FIG. 4. The clip or pin 12 (FIGS. 1 and 4) is connected to the anode of a zero bias Schottky detector diode 14, such as the HSCH-0812, available from Hewlett-Packard (generic HSCH-3486), but other detector diodes can be used, depending upon desired frequency ranges, bandwidths and the like. The diode leads should be maintained as short as possible and painted with a reflective paint to prevent coupling of radiated fields into the diode leads. Preferably, the diode leads should be kept to a maximum of one millimeter in length for 18 GHz operation and, the diode and its connections should be mounted within an RF shielded enclosure, as explained below. The diode should be mounted using techniques such as microstrip or strip line mounting, or other means, for maintaining input impedance substantially constant over the frequency range of interest. One example of such a technique will be described with reference to FIGS. 5A–5B, below. Although the use of a zero bias Schottky detector diode is preferred, non-zero bias diodes can be used but require batteries within the shielded probe to provide an appropriate DC bias.

The anode of diode 14 is connected to pin 12, for insertion into lead 10 of the system under test, by conductor 38, and the cathode of diode 14 is connected to non-metallic conductor 20 by way of conductor 39 and connector 42. The cathode of diode 14 is also connected to non-metallic wire 22 by way of capacitor 44, resistor 46, connected in parallel with capacitor 44, conductor 48 and connector 43, which connects the conductor 48 and non-metallic conductor 22. Conductor 48 is also connected to non-metallic conductor 50 by way of Connector 52. The non-metallic conductors 20 and 50 are connected to an amplifier in the optical transmitter 2, such as the amplifier disclosed in FIG. 2 of U.S. Pat. No. 4,939,446, although the particular form of the amplifier is not critical, in which case non-metallic conductor 20 is applied to the "A" input terminal, and non-metallic conductor 50, is connected to the "G" (ground) terminal of the amplifier, the B terminal remaining unattached. Finally, the anode of diode 14 and the conductor 48 are connected to each other by way of parallel connected resistors 54a and 54b.

In operation, the capacitor 44 charges during conduction of diode 14, and the resistor 46 allows capacitor 44 to repetitively discharge as required to produce the detected envelope. The resistors 54a and 54b stabilize the input impedance to the cathode over the entire input signal bandwidth, thus reducing the standing wave ratio at the cathode to approximately 1.25.

With reference to FIGS. 5A and 5B, a specific implementation of the microwave circuit board 40 will be described, the same reference numerals being used in FIGS. 1, 3, 4, 5A, 5B, 6 and 7 to indicate corresponding elements. Pin 12 is mounted on conductor 38 which is formed of a 57-ohm microstrip trace. Diode 14 is mounted using standard microwave mounting techniques to the 57 ohm microstrip trace 38 at its anode, and at its cathode to conductor 39 which is formed of a copper conductor flange. The flange 39 flares outwardly from the diode as shown, to form a generally triangular shape, which reduces the inductance of the current path between the cathode of the diode and the connector 42 at high frequencies. Conductor 48 is formed of a copper ground plane, underneath a printed circuit board substrate 56 which electrically separates the conductor 48 from the conductor 38 and the copper flange 39. The ground plane immediately below the diode can be etched away to reduce the effect of diode chip parasitic capacitance and achieve the desired frequency response. The parallel resistors 54a and 54b are formed of two 114 ohm microstrip resistors which are deposited by thin film deposition techniques on the 57 ohm microstrip trace 38 and substrate 56, and are connected to the conductor 48 by way of gold foil wraparounds 58a and 58b.

Capacitor 44 is a feed-through capacitor of the flat tubular discoidal type, the outer case thereof being attached to conductors 48 and 39 by either soldering or bolting methods compatible with RF circuit design techniques. The resistor 46 is formed of a coil of non-metallic wire having a resistance of about 10K ohms, connected at its ends to connectors 42 and 52, as will be described, but alternatively, a resistor having a 10K ohm impedance can be employed.

Connector 42 is connected to flange 39 by way of copper block 60, which is soldered to the flange, connectors 43 and 52 are connected to the ground plane conductor 48 by way of copper blocks 62 and 64, respectively, soldered thereto, and pin 12 is connected to conductor 38 by way of copper block 66 similarly soldered thereto. Pin 12 should be less than about one centimeter in length and can be formed of any suitable sharp conductor, such as a portion of a needle, or the like.

Figure 6:
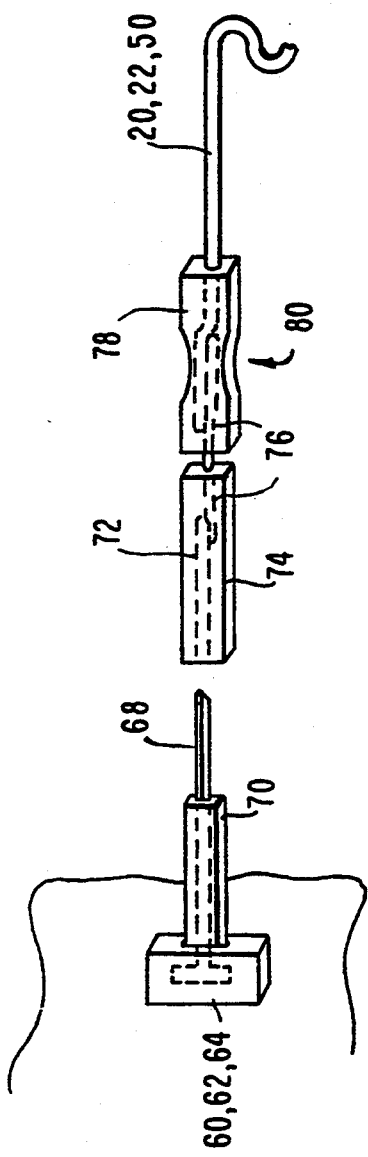
FIG. 6 is a diagram illustrating the detail of the connectors employed in the microwave circuit board implementation of FIGS. 5A and 5B.

The construction of the connectors 42, 43 and 52 will now be described in more detail with reference to FIG. 6. A male pin 68, such as the Dupont/Berg P/N 48116-000 is inserted into a plastic housing 70, such as the Dupont/Berg P/N 65039-036, to give rigidity to the pin 68, and the pin and housing are connected to the circuit board by way of a respective copper block 60, 62 or 64. The female receptacle 72, such as the Dupont/Berg P/N 47745-000, is inserted into an associated plastic housing 74, the same as or similar to housing 70, to add rigidity to the receptacle 72. A conductor 76, such as an 18-gage pin, is soldered to receptacle 72 and inserted into one end of a metallic sleeve 78. One of the non-metallic conductors 20, 22 or 50 is inserted into the other end of metallic sleeve 78 so that it overlaps conductor 76, and the metallic sleeve is crimped at 80 in order to conductively connect the conductor 76 to the non-metallic conductor. In the case of connectors 42 and 52, the respective ends of the resistive coil 46 are inserted into the metallic sleeves 78 along with non-metallic conductors 20 and 50, as shown in FIG. 5B.

Returning to FIGS. 5A and 5B, although not shown to scale, the circuit board 40 will be approximately one-half inch wide, one inch long and one-quarter inch deep. The circuit trace lengths, depths and widths can be determined by those skilled in the art through standard RF design analysis. The circuit board, along with the components thereon, is preferably disposed within a standard RF shielded oscilloscope type probe assembly. Preferably, the connectors 42, 43 and 52 are also disposed within the shielded probe assembly, but if not, they should be separately shielded.

As mentioned above, the non-metallic conductor 20 can be attached to the A input of the amplifier disclosed in the above referenced patent, and non-metallic conductor 50 can be applied to the ground input thereof. Both conductors 20 and 50 can be connected to the amplifier by way of standard shielded BNC connectors 82 and 84, respectively.

The needle 12 is inserted into a system wire 10, and the non-metallic conductor 22 is provided with a needle or pin 86 which is inserted into one end of an associated metallic sleeve 88, the other end of which receives conductor 22. The metallic sleeve 88 is crimped, in a manner similar to that shown in FIG. 6 with respect to metallic sleeve 78, in order to electrically connect the pin 86 to the conductor 22. The pin 86 is inserted into system ground wire 18.

Figure 7:
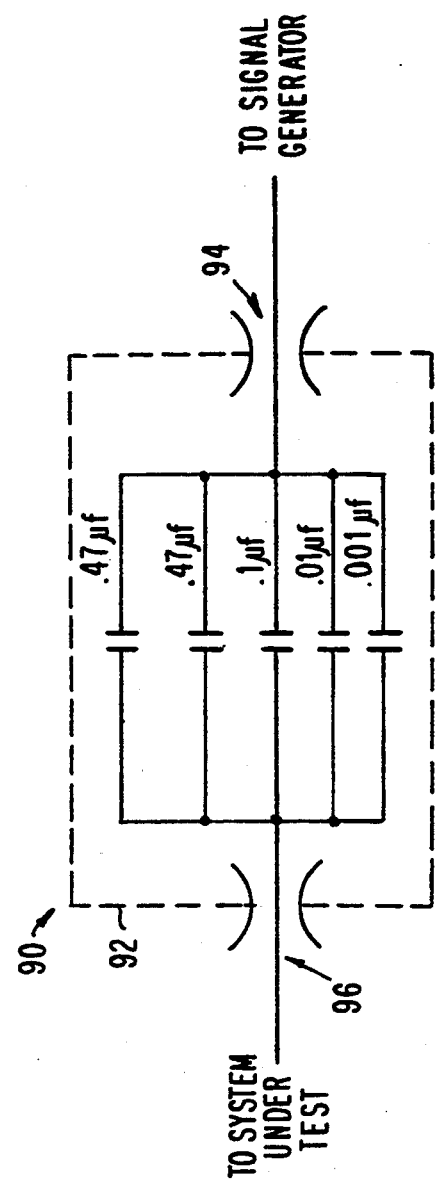
FIG. 7 is a schematic illustration of circuitry employed in voltage injection, in accordance with another aspect of the present invention.

In accordance with another aspect of the present invention, the RF voltage injection probe 90 will be described with reference to FIG. 7. The injection probe is used to inject radio frequency voltages from a standard signal generator (generator 91, FIG. 3) into the system under test in accordance with the test procedures described above. The injection probe is housed in a metallic RF shielded housing 92 and is connected at its input to a standard signal generator, for generating approximately 10 KHz to 18 GHz, amplitude modulated signals by way of coaxial cable 94. The output of the injection probe is connected to wires 10 and 18 of the system under test, by coaxial cable 96, the cable shielding being connected to the housing 92 through the use of standard BNC connectors. Coaxial cable such as that designated RG 259 can be employed, and standard BNC connections can be employed for connection of the cables to the injection probe 90. The connection between the probe 90 and the system wires 10 and 18 can be made with the use of test clips such as those provided by ITT Pomona Electronics, Model Nos. 5188 or 3788, for example. The BNC connectors carry the shield as a ground return.

The injection probe 90 is comprised of five parallel connected capacitors, in this example. Specifically, the 0.47 microfarad capacitors are, in this example, paper type capacitors which function to pass signals between approximately 10 KHz and 100 KHz. The 0.1 microfarad capacitor is, in this example, a plastic type capacitor designed to pass frequencies between about 100 KHz and 20 MHz, and the 0.01 and 0.001 microfarad capacitors are, in this example, of the silver mica type that pass signal frequencies between about 20 MHz and 100 MHz. The coaxial connectors on the shielded housing 92 should incorporate coaxial feedthrough connectors that pass frequencies above approximately 100 MHz.

Injection probe 90 thus comprises a number of parallel capacitive paths for injecting voltages over the desired frequency range, each capacitive path handling a particular frequency range. By employing the injection probe 90, the desired level of voltage for producing voltage level D', in FIG. 2, can be readily achieved using a standard signal generator, without requiring expensive bulk current injectors.

The injection probe characteristics are automatically compensated for since the voltage output from generator 91 (FIG. 3) is adjusted until the correct voltage level is injected into system, as determined by monitoring the detected output, as discussed above.

While illustrative preferred embodiments of the invention have been disclosed herein, many departures from those embodiments may be made without departing from the spirit and scope of the claimed invention, and it is intended that such changes and variations be encompassed, so long as applicant's invention is employed, as defined by the following claims.

I claim:

1. Apparatus for testing the susceptibility of a system to electromagnetic fields in the form of a modulated signal, comprising:
    a detector diode having first and second terminals, the first of said terminals for connection to a wire of said system, to thereby detect the modulation of said modulated signal;
    an electrically overdamped conductor, substantially transparent to electromagnetic fields, connected to said second terminal, for transmitting the modulation detected by said detector diode; and
    a monitor operatively connected to said overdamped conductor for receiving said modulation detected by said detector diode;
    wherein said apparatus is substantially electrically transparent and does not inject electromagnetic signals into said system being tested.

2. The apparatus of claim 1, wherein said detector diode comprises a zero bias Schottky diode.

3. The apparatus of claim 1, wherein said modulation is amplitude modulation.

4. The apparatus of claim 1, wherein said detector diode is disposed within an RF-shielded enclosure.

5. The apparatus of claim 1, wherein the anode of said detector diode is connected to said system, and wherein the cathode of said diode is connected to a ground wire of said system by way of another electrically overdamped conductor.

6. The apparatus of claim 1, wherein said monitor is operatively connected to said overdamped conductor by way of an optical transmission link.

7. Apparatus for testing the susceptibility of a system to electromagnetic fields comprising:
    a modulation detector for connection to a system under test, to determine the level of modulation of a signal in said system;
    a monitor for monitoring voltages; and
    a transmission link, including an electrically overdamped conductor substantially transparent to electromagnetic fields, for applying a signal produced by said modulation detector to said monitor,
    wherein, in the presence of electromagnetic fields, said modulation detector and transmission link inject substantially no electromagnetic signals into said system, and wherein said monitor monitors the level of electromagnetic signals coupled into said system in the presence of electromagnetic fields.

8. The apparatus of claim 7, wherein the modulation detector is a diode having its anode connected to the system under test, and its cathode connected to said transmission link.

9. The apparatus of claim 8, wherein the cathode of said diode is connected to a ground wire of said system by way of an additional electrically overdamped conductor.

10. The apparatus of claim 9, wherein said cathode is connected to said additional electrically overdamped conductor by way of a capacitor and a resistor connected in parallel.

11. The apparatus of claim 10, wherein said modulation detector further comprises at least one resistive element connected between the anode of said diode and said additionally electrically overdamped conductor.

12. The apparatus of claim 9, wherein said diode is enclosed in an RF-shielded enclosure.

13. The apparatus of claim 7, wherein said cathode of said diode is connected to said transmission link by way of a conductor adapted to maintain the input impedance of the diode constant throughout a range of frequencies.

14. The apparatus of claim 13, wherein said cathode is connected to said transmission link using a conductor having a generally triangular shape.

15. The apparatus of claim 7, wherein said transmission link further includes an optical transmission and reception means.

16. A probe for sensing modulated signals coupled onto wires of a system being tested for susceptibility to electromagnetic fields comprising:
    a detector diode having first and second terminals, the first of said terminals for connection to a wire of said system, to thereby detect the modulation of said modulated signals; and
    an electrically overdamped conductor, substantially transparent to said electromagnetic fields, connected to said second terminal, for transmitting the modulation detected by said detector diode to a monitor;
    wherein said probe is substantially transparent to said electromagnetic fields and does not inject said fields into said system being tested.

17. The apparatus of claims 1, 7, or 16 wherein the electrically overdamped conductor is overdamped in a distributed fashion.

18. The apparatus of claims 1, 7 or 16 wherein the electrically overdamped conductor is one or more monofilament cores, each core having a distributed resistance along its length.

19. The apparatus of claim 18 wherein the distributed resistance is in the range of 20,000 to 30,000 ohms per foot.

20. The probe of claim 16, wherein the first terminal of said detector diode is the anode of said diode, said second terminal is the cathode of said diode, and further comprising an additional electrically overdamped conductor for connecting said cathode of said diode to a ground conductor of said system.

21. The probe of claim 20, wherein said cathode is connected to said additional electrically overdamped conductor by way of a capacitor and resistor connected in parallel.

22. The probe of claim 21 further including at least one resistive element connected between said anode and said additional electrically overdamped conductor.

23. The apparatus of claim 9, 11, 15, or 20 wherein each electrically overdamped conductor is overdamped in a distributed fashion.

24. The probe of claim 16, wherein said detector diode is comprised of a zero bias Schottky detector diode.

25. The probe of claim 16, wherein said detector diode is enclosed within an RF-shielded enclosure.

26. The probe of claim 16, wherein said detector diode detects amplitude modulation.

27. A method of determining the level of electromagnetic signal coupled into the wires of a system in the presence of an electromagnetic field, comprising the steps of:
    attaching a modulation detector to a wire in said system;
    operatively connecting said modulation detector to a voltage monitor by way of at least an electrically overdamped conductor, substantially transparent to said electromagnetic field;
    exposing said system to said electromagnetic field; and
    transmitting a signal from said modulation detector, indicative of the level of said electromagnetic signal coupled into the wires of said system, to said voltage monitor through said electrically overdamped conductor, said modulation detector and said electrically overdamped conductor injecting substantially none of said electromagnetic field into said system wires.

28. The method of claim 27, wherein the step of attaching a modulation detector includes the step of attaching the anode of a diode to said system, and the step of operatively connecting includes the step of attaching the cathode of a diode to said electrically overdamped conductor.

29. The method of claim 28, further including the step of connecting the cathode of said diode to a ground wire of said system by way of an additional electrically overdamped conductor.

30. The method of claim 29, further including the step of connecting the cathode of said diode to said additional electrically overdamped conductor by way of a capacitor and resistor connected in parallel.

31. The method of claim 30, further including the step of connecting at least one resistive element between the anode of said diode and said additional electrically overdamped conductor.

32. The method of claims 29, 30 or 31 wherein each electrically overdamped wire is overdamped in a distributed fashion.

33. The method of claim 29 wherein each electrically overdamped conductor is non-metallic.

34. The method of claim 27, wherein said step of exposing said system includes the step of exposing said system to an amplitude modulated electromagnetic "E" field.

35. The method of claim 27 wherein the electrically overdamped conductor is non-metallic.

36. The method of claim 27 wherein the electrically overdamped wire is overdamped in a distributed fashion.

37. A method of detecting the level of an electromagnetic signal coupled into an electrical circuit in an electromagnetic field comprises the steps of:
    (a) exposing the circuit to an amplitude modulated electromagnetic field;
    (b) monitoring a signal produced in the circuit while the circuit is in the amplitude modulated electromagnetic field; and
    (c) coupling the monitored signal to a receiver that is outside of the amplitude modulated electromagnetic field.

38. The method of claim 37 wherein step (b) further comprises:
    (a) passing the monitored signal through a detector to detect the modulating waveform on the monitored signal; and
    (e) passing the modulating waveform to the receiver.

39. The method of claim 38 wherein step (d) further comprises passing the signal through a detector diode to detect the modulation of the monitored signals.

40. The method of claim 39 wherein the detector diode is a Schottky detector diode.

41. The method of claims 39 or 40 wherein the detector diode has a cathode and an anode and further comprising grounding the cathode of the detector diode across a capacitor.

42. The method of claims 37 or 38 wherein step (c) further comprises passing the monitored signal through a non-metallic wire transparent to the electromagnetic fields.

43. The method of claim 42 wherein the non-metallic wire is electrically overdamped in a distributed fashion.

44. The method of claims 37 or 38 wherein step (c) further comprises passing the monitored signal through an electrically overdamped wire transparent to the electromagnetic fields.

45. The method of claim 44 wherein the electrically overdamped wire is non-metallic and overdamped in a distributed fashion.

46. The method of claim 38 wherein step (d) further comprises connecting the detector to the circuit using a conductive member that is electrically shielded from the electromagnetic field.

47. The method of claim 38 wherein step (e) further comprises:
    passing the monitored signal through an electrically overdamped wire;
    converting the amplified signals to optical signals; and
    passing the optical signals over an optical signal transmission line to the receiver.

48. The method of claim 47 wherein the electrically overdamped wire is non-metallic and is overdamped in a distributed fashion.

49. The method of claim 47 wherein the monitored signal is amplified by a gain on the order of 1000 or more.

50. The method of claim 47 wherein step (d) further comprises passing the signal through a detector diode to detect the modulation of the monitored signals.

51. The method of claim 50 wherein the detector diode is a Schottky detector diode.

52. The method of claims 50 or 51 wherein the detector diode has a cathode and an anode further comprising connecting the cathode to ground across a capacitor.

53. The method of claim 37 further comprising monitoring at a video display device the modulated waveform passed to the receiver.

54. The method of claim 53 further comprising converting the modulated waveform to a D.C. average voltage level prior to passing it to the video display device.

55. The method of claim 37 wherein the step (a) further comprises exposing the circuit to the amplitude modulated electromagnetic field inside a screen room having an enclosure, wherein the receiver is located outside the enclosure.

56. The method of claim 55 wherein step (c) further comprises passing the monitored signal over a transmission line that is transparent to the radiation field and providing a waveguide beyond cutoff filter in the screen room enclosure for passing the transmission line therethrough to the receiver.

* * * * *